(12) United States Patent
Kim et al.

(10) Patent No.: US 12,405,869 B2
(45) Date of Patent: Sep. 2, 2025

(54) TEST APPARATUS FOR TESTING A MOBILE AP

(71) Applicant: TSE CO., LTD., Chungcheongnam-do (KR)

(72) Inventors: Min Cheol Kim, Chungcheongnam-do (KR); Sol Lee, Chungcheongnam-do (KR)

(73) Assignee: TSE CO., LTD., Chungcheongnam-Do (KR)

( * ) Notice: Subject to any disclaimer, the term of this patent is extended or adjusted under 35 U.S.C. 154(b) by 415 days.

(21) Appl. No.: 18/151,872

(22) Filed: Jan. 9, 2023

(65) Prior Publication Data
US 2023/0236941 A1    Jul. 27, 2023

(30) Foreign Application Priority Data
Jan. 25, 2022 (KR) .................. 10-2022-0011042

(51) Int. Cl.
*G06F 11/22* (2006.01)
*G01R 31/28* (2006.01)
*H04M 1/24* (2006.01)

(52) U.S. Cl.
CPC ...... *G06F 11/2236* (2013.01); *G01R 31/2863* (2013.01); *H04M 1/24* (2013.01)

(58) Field of Classification Search
CPC ... G06F 11/2236; G01R 31/2863; H04M 1/24
(Continued)

(56) References Cited

U.S. PATENT DOCUMENTS 8,040,140 B2 * 10/2011 Ryskoski ............. G01R 1/0433
                                                          324/756.05
11,199,577 B2 * 12/2021 Oh ..................... G01R 31/2889
(Continued)

FOREIGN PATENT DOCUMENTS

KR    10-20150003955 A    1/2015
KR    10-1976730 B1       5/2019
(Continued)

OTHER PUBLICATIONS

Office Action dated Nov. 3, 2023 (10 pages including English translation) out of corresponding South Korean Application 10-2022-0011042.
(Continued)

*Primary Examiner* — Jami Valentine Miller
(74) *Attorney, Agent, or Firm* — Crowell & Moring, LLP; John C. Freeman (57) ABSTRACT

A test apparatus for testing a mobile AP provided with an AP package and a memory package according to the disclosure is configured to include: a lower test socket mounted on a tester and connected to the AP package put on an upper side thereof; an upper test socket mounted with the memory package and connected to the AP package put on a lower side thereof; an upper mechanism configured to accommodate the memory package and mounted with the upper test socket; and a heat dissipation device disposed on the upper mechanism. Since heat generated in the AP package can be dissipated through forming of a frame of the upper test socket as an inelastic conductive housing of a metal material
(Continued)

having high thermal conductivity, a test can be performed in a step before stacking the AP package and the memory package on each other.

9 Claims, 7 Drawing Sheets (58) Field of Classification Search
USPC .......................................................... 438/14
See application file for complete search history.

(56) References Cited

U.S. PATENT DOCUMENTS

| | | |
|---|---|---|
| 11,609,244 B2 | 3/2023 | Oh et al. |
| 2001/0020546 A1* | 9/2001 | Eldridge ............ G01R 1/07378 |
| | | 257/E21.507 |
| 2015/0168450 A1* | 6/2015 | Wooden ............... G01R 1/0466 |
| | | 324/756.02 |
| 2016/0378581 A1* | 12/2016 | Klazynski ........... G06F 11/2635 |
| | | 714/37 |
| 2019/0302144 A1* | 10/2019 | Nakamura ......... H01R 13/2421 |
| 2021/0293880 A1* | 9/2021 | Oh ....................... G01R 1/0483 |
| 2021/0302468 A1 | 9/2021 | Oh et al. |
| 2021/0302494 A1 | 9/2021 | Oh |
| 2023/0236941 A1* | 7/2023 | Kim ........................ H04M 1/24 |
| | | 714/30 |
| 2023/0324456 A1* | 10/2023 | Varadarajan ....... G01R 31/3177 |
| | | 714/732 |

FOREIGN PATENT DOCUMENTS

| | | |
|---|---|---|
| KR | 10-2141803 B1 | 8/2020 |
| KR | 10-2211358 B1 | 2/2021 |
| TW | 201610444 A | 3/2016 |
| TW | 201945739 A | 12/2019 |
| TW | 202136783 A | 10/2021 |
| TW | 202136784 A | 10/2021 |

OTHER PUBLICATIONS

Office Action dated Jan. 4, 2024 (11 pages including English translation) out of corresponding Taiwan Patent Application No. 112101366.

* cited by examiner

FIG. 7

TEST APPARATUS FOR TESTING A MOBILE AP

CROSS-REFERENCE TO RELATED APPLICATION

This application is based on and claims priority under 35 U.S.C. § 119 to Korean Patent Application No. 10-2022-0011042 filed on Jan. 25, 2022, in the Korean Intellectual Property Office, the disclosure of which is herein incorporated by reference in its entirety.

BACKGROUND

Field

The disclosure relates to the test of a mobile application processor (AP), and more particularly, to a test apparatus for testing whether a mobile AP, in which an AP package and a memory package are stacked up and down, operates normally.

Description of Related Art

Recently, in a smart phone that is a device having been used by a lot of people, a mobile application processor (AP) that plays the same role as the role of a central processing unit (CPU) of a general computer is built. The mobile AP is a memory chip for mobile, and is a core semiconductor that takes charge of operations of various kinds of applications and graphic processing.

The mobile AP is provided with an AP package and a memory package, and the AP package is a system on chip (SoC) including all of a function of a central processing unit (CPU) of a computer and a function of a chipset controlling connections of other equipment, such as a graphic card and the like.

As a smart phone becomes lighter, thinner, shorter, and smaller, an area of a main board on which a mobile AP is mounted become insufficient, and thus a package on package (PoP) type structure in which a memory package is vertically stacked on an AP package has been most used as a packaging platform of the mobile AP.

Figure 1:
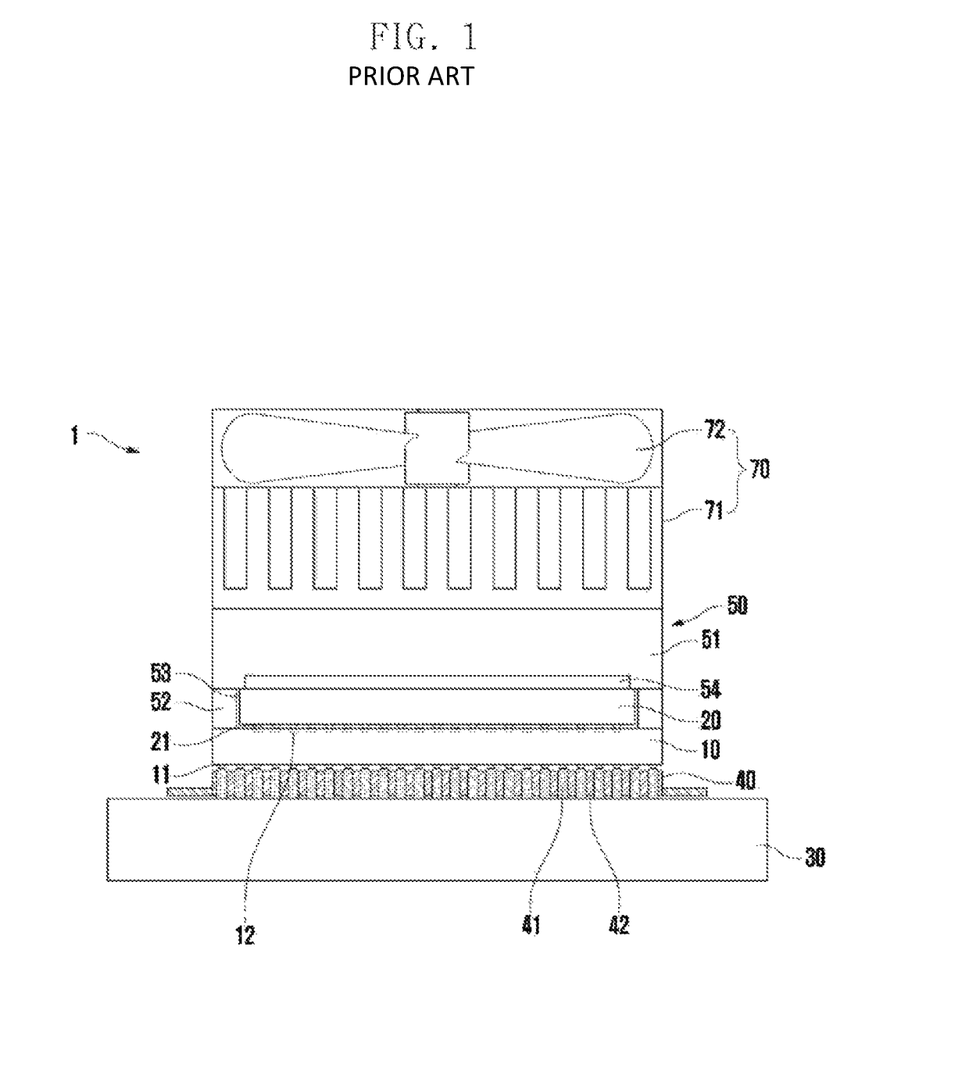
FIG. 1 schematically illustrates a test apparatus in the related art for testing a mobile AP.

In general, a reliability test, such as an electrical die sorting (EDS) and a function test of a mobile AP, in a state where an AP package and a memory package are stacked is performed by using a test apparatus illustrated in FIG. 1.

As illustrated in FIG. 1, a text apparatus 1 in the related art for testing a mobile AP performs a test in a state where a memory package 20 is mounted on an AP package 10, and includes a test socket 40 for transferring electrical signals, an upper mechanism 50, and a heat dissipation device 70.

The test socket 40 is a rubber type socket having a structure in which conductive parts 41 in the form in which a plurality of conductive particles are included inside a material having elasticity, such as silicone, are disposed to be insulated from one another inside insulation parts 42 made of a material having elasticity, such as silicone, and the test socket 40 is installed on a tester 30 so that each of the conductive parts 41 of the test socket 40 is electrically connected to each lower terminal 11 of each AP package 10 in a state where each terminal 21 of the memory package 20 is connected to each upper terminal 12 of the AP package 10.

The upper mechanism 50 is provided with a body part 51, an accommodation part 53 accommodating the memory package 20, a pushing part 54 pushing the memory package 20, and a contact part 52 coming in contact with the AP package, and is formed so that the accommodation part 53 accommodates the memory package 20, and the contact part 52 comes in contact with an upper side of the AP package 10. A heat dissipation device 70, such as a heat dissipation plate 71 and a cooling fan 72, is disposed on the upper mechanism 50 like a pusher or a handler.

In the test apparatus, as the pushing part 54 disposed on the upper mechanism 50 descends and pushes an upper side of the memory package 20, the conductive parts 41 of the test socket 40 and the lower terminals 11 of the AP package 10 are connected to each other, and the tester 30, the test socket 40, the AP package 10, and the memory package 20 are electrically connected to one another, so that the electrical test is performed. That is, the test apparatus in the related art tests the mobile AP only with one test socket 40.

In the process of proceeding with the test, a lot of heat over 3 Watts is generated per size about 15 mm in height and width of the AP package 10, and thus unless a proper heat dissipation means is provided, the AP package 10 deteriorates to cause the test not to be normally performed. Accordingly, in order to transfer the heat generated from the AP package 10 to the heat dissipation device 70 through the upper mechanism 50 that comes in contact with the AP package 10, the test apparatus 1 in the related art adopts a structure in which the test is performed in a state where the memory package 20 is mounted on the AP package 10.

However, in case that the memory package 20 is selected as defective in the process of proceeding with the test in the state where the memory package 20 is mounted on the AP package 10, it is unable to know whether the defect occurs in both the memory package 20 and the AP package 10 or in any one of the memory package 20 and the AP package 10, and there is a problem in that both the memory package 20 and the AP package 10 should be discarded.

PRIOR ART DOCUMENT

Patent Document (Patent document 1) Korean Patent Application Publication No. 2015-0003955 (Jan. 12, 2015)

SUMMARY

The disclosure has been proposed in consideration of the above-described points, and an aspect of the disclosure is to provide a test apparatus for testing a mobile AP, which can precisely test whether the mobile AP operates normally even in a state where a memory package and an AP package of the mobile AP are not stacked on each other.

Further, another aspect of the disclosure is to provide a test apparatus for testing a mobile AP, which can effectively remove heat being generated in an AP package.

According to the disclosure to achieve the above-described aspects, a test apparatus for testing a mobile AP provided with an AP package and a memory package may include: a lower test socket mounted on a tester and connected to the AP package put on an upper side thereof; an upper test socket mounted with the memory package and connected to the AP package put on a lower side thereof; an upper mechanism configured to accommodate the memory package and mounted with the upper test socket; and a heat dissipation device disposed on the upper mechanism, wherein the upper test socket is configured to include an inelastic conductive housing provided with a plurality of housing holes penetratingly formed in a thickness direction, an insulating coating layer coated around the plurality of housing holes, and a conductive part formed in a form in which a plurality of conductive particles are included in an elastic insulating material, disposed in the housing holes, and insulated from the inelastic conductive housing by the insulating coating layer.

The inelastic conductive housing may be made of a material having a thermal conductivity that is equal to or greater than 10 W/mK.

The inelastic conductive housing may be made of a metal material.

The memory package may be a golden device that is a good quality package.

The insulating coating layer may be coated all over the inelastic conductive housing.

The insulating coating layer may be formed by a coating method selected among Teflon coating, DLC coating, parylene coating, anodizing treatment, and liquid silicone coating.

The heat dissipation device may include a heat dissipation plate or a cooling fan.

The upper mechanism may be a pusher or a handler.

The conductive part may include a conductive part body put in the housing hole, and at least one of a conductive part lower bump projecting from a lower surface of the inelastic conductive housing or a conductive part upper bump projecting from an upper surface of the inelastic conductive housing, being connected to the conductive body.

According to the test apparatus for testing the mobile AP according to the disclosure, since the AP package can be cooled by transferring the heat generated from the AP package to the heat dissipation device disposed on the upper mechanism through the upper test socket, through forming of the frame of the upper test socket as the inelastic conductive housing of a metal material having high thermal conductivity, it is possible to perform the performance test, which was unable to be performed due to the heat problem of the AP package, even in the step before mounting the memory package on the AP package, and thus the number of entire test processing steps can be reduced to reduce the cost.

Further, according to the test apparatus for testing the mobile AP according to the disclosure, the packages are stacked in a state where the reliability test of the memory package and the AP package is completed, and thus the yield can be increased.

Further, according to the test apparatus for testing the mobile AP according to the disclosure, since the limits of the load being applied to the upper test socket can be increased by using the frame of the metal material as the frame of the upper test socket, the durability of the test socket can be increased, and thus the lifetime thereof can be improved.

Further, according to the test apparatus for testing the mobile AP according to the disclosure, since the upper test socket has a coaxial cable structure, the high-frequency signal transmission characteristic is excellent, and the signal transmission loss can be minimized due to less high-frequency signal interference between the conductive parts.

Further, according to the test apparatus for testing the mobile AP according to the disclosure, it is possible to test whether the AP package operates normally by constituting the memory package as a good quality package preselected with a good quality, and thus, it is possible to be immediately aware of whether the AP package is defective.

DETAILED DESCRIPTION

Hereinafter, a test apparatus for testing a mobile AP according to the disclosure will be described in detail with reference to the accompanying drawings.

Figure 2:
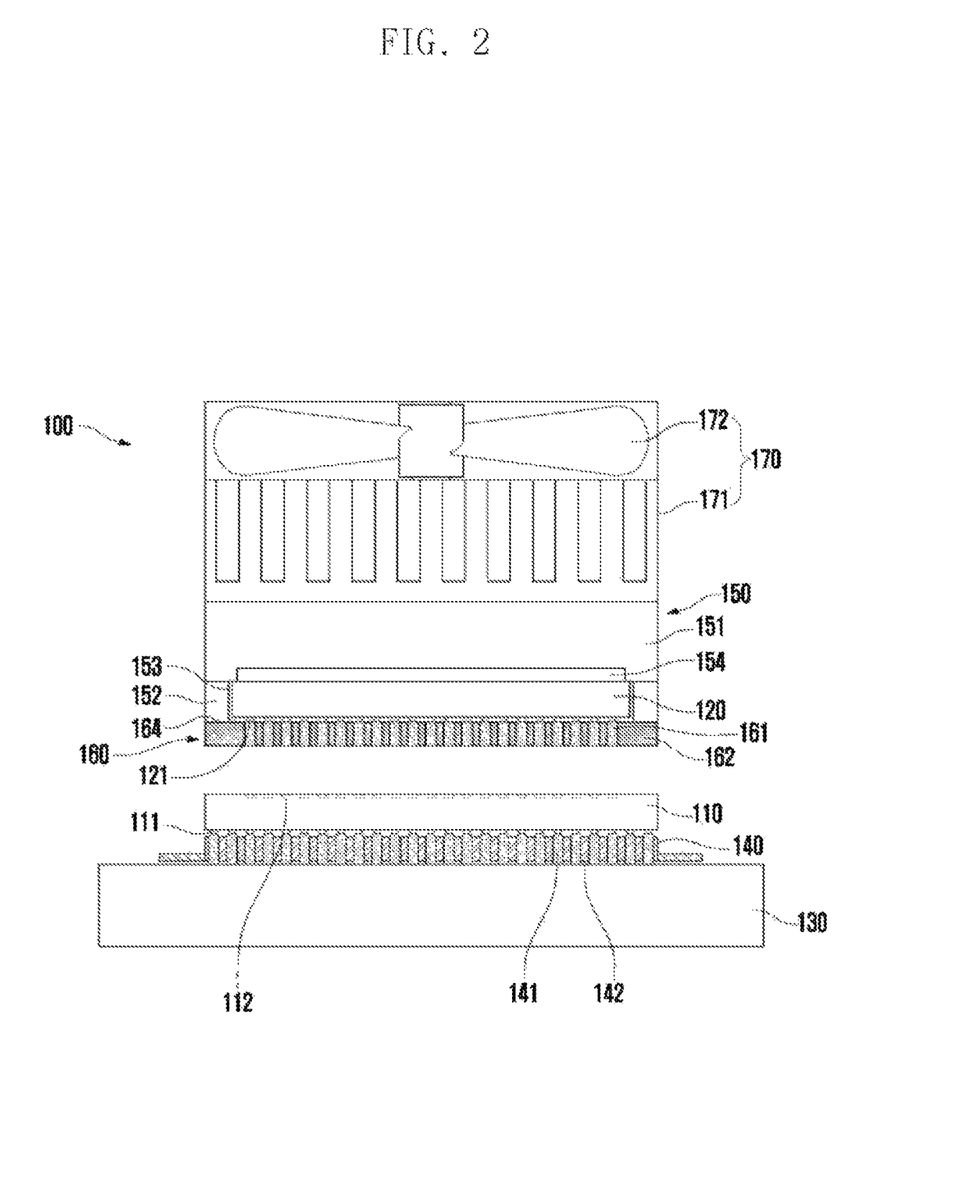
FIG. 2 schematically illustrates a test apparatus for testing a mobile AP according to an embodiment of the disclosure.
Figure 3:
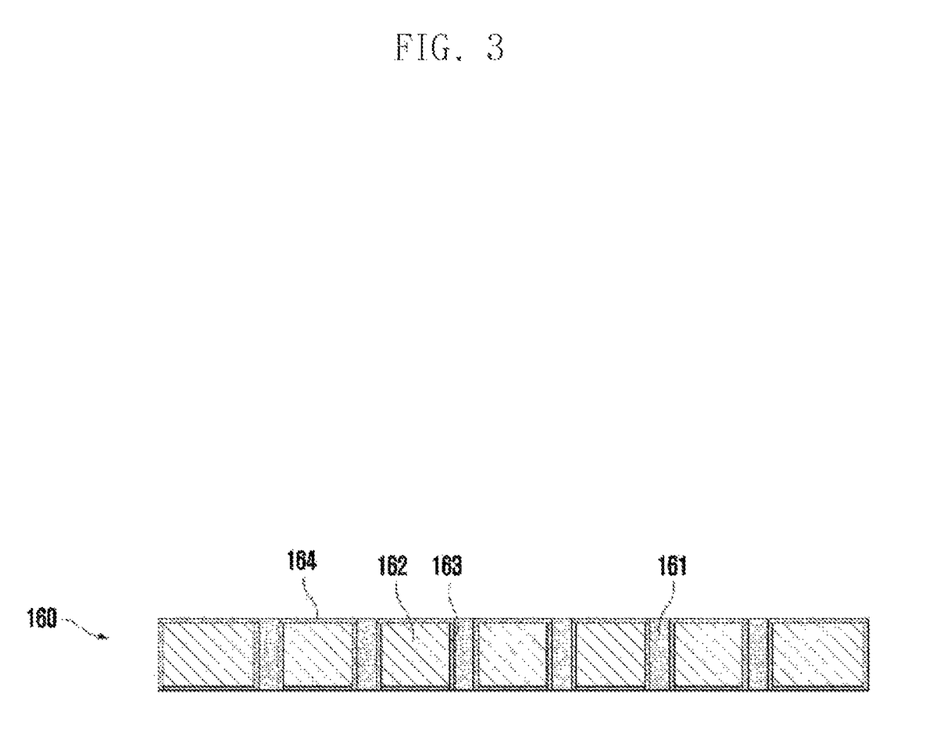
FIG. 3 is a front cross-sectional view illustrating an upper test socket provided in a test apparatus according to an embodiment of the disclosure.
Figure 4:
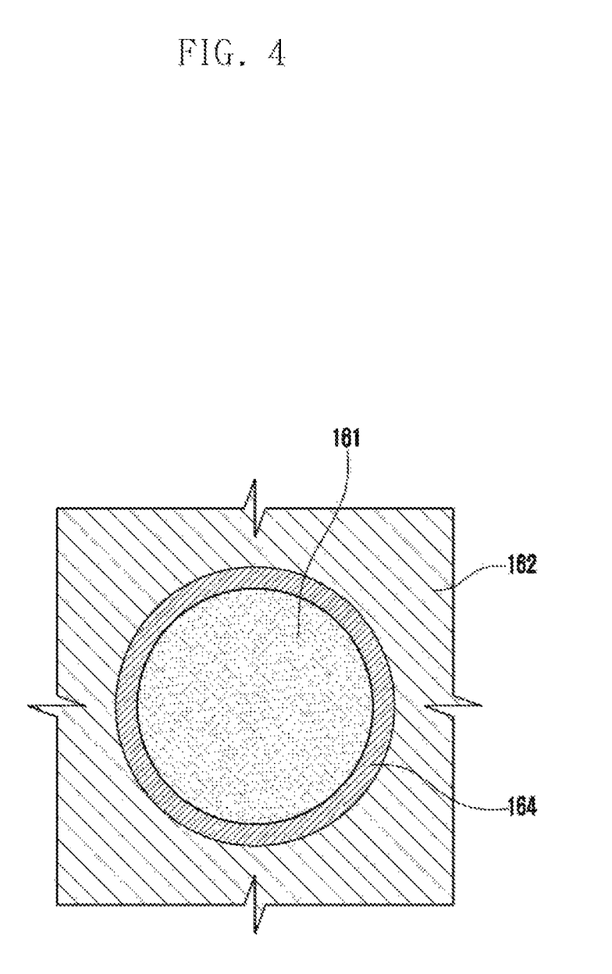
FIG. 4 is a plan cross-sectional view illustrating a part of an upper test socket provided in a text apparatus according to an embodiment of the disclosure.
Figure 5:
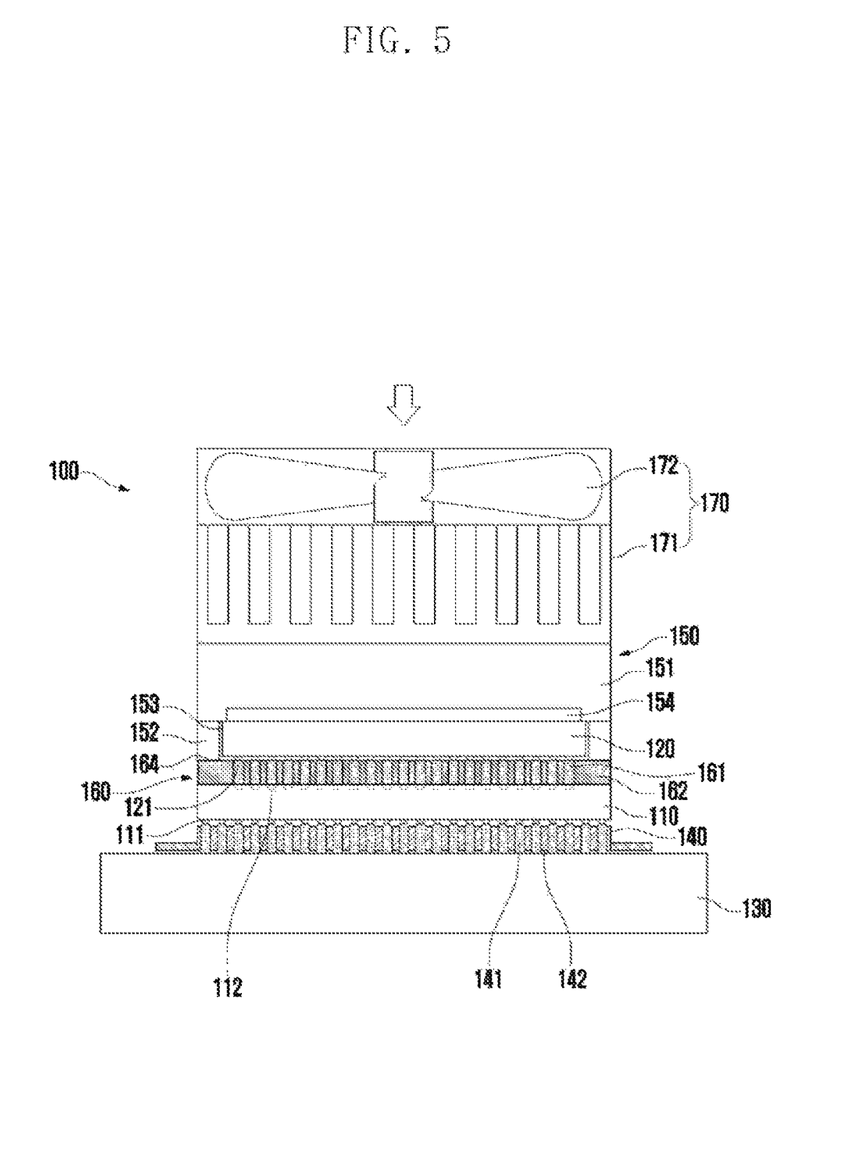
FIG. 5 is to explain an operation of a test apparatus according to an embodiment of the disclosure.

FIG. 2 schematically illustrates a test apparatus for testing a mobile AP according to an embodiment of the disclosure, FIG. 3 is a front cross-sectional view illustrating an upper test socket provided in a test apparatus according to an embodiment of the disclosure, FIG. 4 is a plan cross-sectional view illustrating a part of an upper test socket provided in a test apparatus according to an embodiment of the disclosure, and FIG. 5 is to explain an action of a test apparatus according to an embodiment of the disclosure.

As illustrated in the drawings, a test apparatus 100 for testing a mobile AP according to an embodiment of the disclosure includes: a lower test socket 140 mounted on a tester 130 and connected to the AP package 110 put on an upper side thereof; an upper test socket 160 mounted with the memory package 120 and connected to the AP package 110 put on a lower side thereof; an upper mechanism 150 configured to accommodate the memory package 120 and mounted with the upper test socket 160; and a heat dissipation device 170 disposed on the upper mechanism 150. That is, the test apparatus according to the disclosure tests the mobile AP by using the lower test socket 140 and the upper test socket 160.

The lower test socket 140 is a rubber type socket having a structure in which a first conductive parts 141 in the form in which a plurality of conductive particles are included inside a material having elasticity, such as silicone, are disposed to be insulated from one another inside insulation parts 142 made of a material having elasticity, such as silicone. Since the lower test socket 140 uses the rubber type socket in which a mechanical means, such as soldering or spring, is not used, it has an advantage in that it has an excellent durability and can minimize the damage of the AP package.

The lower test socket 140 may be mounted on the tester 130, and the first conductive part 141 has a lower end part that is connected to a signal electrode (not illustrated) of the tester 130 put on a lower side, and an upper end part that is connected to a lower terminal 111 of the AP package 110 put on an upper side.

The upper mechanism 150 corresponds to a pusher or a handler made of a metal material, and is provided with a body part 151, a contact part 152 surrounding an outside of a lower end of the body part 151, an accommodation part 153 accommodating the memory package 120 in an accommodation space in the contact part 152, and a pushing part 154 pushing the memory package 120. The contact part 152 is formed to come in contact with an upper surface of the upper test socket 160. Further, the heat dissipation device 170, such as a heat dissipation plate 171 and a cooling fan 172, is disposed on the upper mechanism 150.

The upper test socket 160 is mounted with the memory package 120 thereon, and the upper surface of the upper test socket 160 is attached to the contact part 152 of the upper mechanism so as to be disposed to seal the accommodation part 153 of the upper mechanism. The lower surface of the upper test socket 160 is disposed to come in contact with the upper surface of the AP package 110.

The upper test socket 160 includes an inelastic conductive housing 162 having a plurality of housing holes 163, an insulating coating layer 164 coated on the inelastic conductive housing 162, and a second conductive part 161 disposed in the plurality of housing holes 163 to penetrate the inelastic conductive housing 162 in a thickness direction.

The inelastic conductive housing 162 is made of a metal material having excellent thermal conductivity. It is preferable that the inelastic conductive housing 162 is made of the metal material having the thermal conductivity that is equal to or greater than 10 W/mK. As the metal material, conductive metals, such as aluminum, copper, brass, SUS, iron, and nickel, or various materials having conductivity and excellent thermal conduction characteristics may be used. The plurality of housing holes 163 provided on the inelastic conductive housing 162 are formed to penetrate the inelastic conductive housing 162 in the thickness direction.

The insulating coating layer 164 is coated on the inelastic conductive housing 162 in the form of a thin film with an even thickness. The insulating coating layer 164 is coated around at least the plurality of housing holes 163 of the inelastic conductive housing 162. The insulating coating layer 164 being coated around the housing holes 163 insulates the second conductive part 161 disposed in the housing holes 163 from the inelastic conductive housing 162.

It is preferable that the insulating coating layer 164 is coated on the upper surface and the lower surface of the inelastic conductive housing 162. The insulating coating layer 164 coated on the upper surface of the inelastic conductive housing 162 may insulate the inelastic conductive housing 162 and the memory package 120 put thereon from each other, and the insulating coating layer 164 coated on the lower surface of the inelastic conductive housing 162 may insulate the inelastic conductive housing 162 and the AP package 110 put thereunder from each other.

Further, the insulating coating layer 164 may be coated all over the inelastic conductive housing 162. By coating the insulating coating layer 164 all over the inelastic conductive housing 162, a coating process can be simplified, and thus a coating time can be shortened.

The insulating coating layer 164 may be coated on the inelastic conductive housing 162 by a coating method selected among Teflon coating, diamond-like-carbon (DLC) coating, parylene coating, anodizing treatment, and liquid silicone coating.

The Teflon coating is a coating method in which fluoric carbon resin is painted and coated on a material such as metal, and it is possible to form the insulating coating layer 164 on the inelastic conductive housing 162 by using the Teflon coating. The insulating coating layer 164 coated on the inelastic conductive housing 162 through the Teflon coating has insulation.

The DLC coating is a coating method in which a coating layer is deposited on a desired surface by generating plasma in a vacuum state by using a gas of carbon ingredient that is a main ingredient of diamond, and it is possible to form the insulating coating layer 164 on the inelastic conductive housing 162 by using the DLC coating.

The parylene coating is a method for forming an insulating film in a polymer form with a powder-state dimer by using chemical vapor deposition (CVD), and it is possible to form the insulating coating layer 164 on the inelastic conductive housing 162 by using this method. The parylene coating method may include: evaporating a power-state dimer by heat, converting the evaporated dimer into a gas state through a thermal decomposition part, cooling the gas-state dimer before the gas-state dimer is diffused into a vacuum chamber, and polymerizing cooled gas particles in a vacuum chamber and coating the surface of a processing object with the gas particles in a film form. Since the polymerization reaction of the parylene coating occurs at a very low pressure and at room temperature, thermal stress does not occur on the surface of the processing object. Unlike a wet coating method, the parylene coating is performed even in a tiny gap, and a uniform insulating film can be formed regardless of the shape, such as a sharp needle, hole, edge, corner, and tiny hole.

As the anodizing treatment technique, a hard anodizing method is a method for converting an aluminum metal surface into an alumina ceramic by using an electrochemical method, and the insulating coating layer 164 can be formed on the inelastic conductive housing 162 by using the hard anodizing method. If the aluminum metal is hard anodized, the aluminum metal itself is oxidized, and changed to the alumina ceramic. The alumina ceramic has excellent wear resistance and electrical insulation without causing a peeling problem like plating or painting.

In case of using the liquid silicone coating method, by immersing the inelastic conductive housing 162 in a liquidized silicone liquid, it is possible to form the insulating coating layer 164 composed of a silicone film on the inelastic conductive housing 162.

In addition, various other methods may be used in forming the insulating coating layer 164 on the inelastic conductive housing 162.

The second conductive part 161 may be in a form in which plural conductive particles are included in an elastic insulating material so that the upper end part of the second conductive part 161 can be connected to the terminal 121 of the memory package 120, and the lower end part thereof can be connected to the upper terminal 112 of the AP package 110. The second conductive part 161 comes in contact with the insulating coating layer 164 disposed around the housing hole 163, and is insulated from the inelastic conductive housing 162 by the insulating coating layer 164.

In the related art, since the frame of the upper test socket is composed of an insulating material having an elastic force, such as silicone, it has too high insulation, and the heat generated in the AP package is not transferred to the heat dissipation device, but is blocked, so that the AP package deteriorates and a normal test is unable to be performed.

Accordingly, the upper test socket 160 of the disclosure solves this problem by forming a structure that is different from the structure of the typical rubber type socket. Although the conductive part of the upper test socket 160 is in the form in which a plurality of conductive particles are included in the material having elasticity, such as silicone, the frame supporting the conductive part uses a metal material having high thermal conductivity instead of a material having elasticity, such as silicone, and has a structure that is insulated from the conductive part by the insulating coating layer.

Since the upper test socket 160 is disposed so that the lower surface of the upper test socket 160 comes in contact with the upper surface of the AP package 110, and the upper surface of the upper test socket 160 comes in contact with the lower surface of the upper mechanism 150, the upper test socket 160 can transfer the heat generated in the AP package 110 put on the lower side to the upper mechanism 150 through the inelastic conductive housing 162 compose of a material having high thermal conductivity, and the heat dissipation device 170 can cool the heat, so that the test can be performed with the heat generation problem of the AP package solved. Accordingly, it is possible to perform the performance test in the step before mounting the memory package 120 on the AP package 110, and thus the number of test processing steps can be reduced to reduce the cost.

Further, as illustrated in FIG. 4, the upper test socket 160 according to an embodiment of the disclosure has a coaxial cable structure since the insulating coating layer 164 surrounds the second conductive part 161 that transmits signals, and the inelastic conductive housing 162 surrounds the insulating coating layer 164. Accordingly, the high-frequency signal transmission characteristic is excellent, and the signal transmission loss can be minimized due to less high-frequency signal interference between the second conductive parts 161.

Further, the upper test socket 160 according to an embodiment of the disclosure is good for high-speed signal transfer since the characteristic impedance matching is possible through adjustment of the diameter of the second conductive part 161 or the distance between the second conductive part 161 and the inelastic conductive housing 162.

As illustrated in FIG. 5, if the memory package 120 is pushed toward the upper test socket 160 through the pushing part 154 disposed on the upper mechanism 150, the terminal 121 of the memory package 120 is pressed onto the upper end part of the second conductive part 161, and the lower end part of the second conductive part 161 is pressed onto the upper terminal 112 of the AP package 110. When the terminal 121 of the memory package 120 is pressed onto the upper end part of the second conductive part 161, which has elasticity, and the lower end part of the second conductive part 161 is pressed onto the upper terminal 112 of the AP package 110, the memory package terminal 121 and the upper terminal 112 of the AP package may enter into an inside of the housing hole 163 while elastically deforming the second conductive part 161.

As the pushing force of the pushing part 154 disposed on the upper mechanism 150 is transferred to the AP package 110 through the upper test socket 160, the AP package 110 pushes the lower test socket 140, and thus the tester 130, the lower test socket 140, the AP package 110, the upper test socket 130, and the memory package 120 are electrically connected to each other. In this state, a test signal being generated from the tester 160 is transferred to the AP package 110 and the memory package 120, and thus an electrical test may be performed to test whether the AP package 110 operates normally and whether the AP package 110 and the memory package 120 match each other properly.

In the test apparatus 100 of the disclosure, as the memory package 120, a so-called golden device may be used, which is composed of a good quality package preselected as a good quality one, and may be used to test whether the AP package 110 operates normally. The memory package 120 composed of the golden device is advantageous to test not only whether the AP package 110 operates normally but also whether the AP package 110 matches the memory package 120 properly when they are stacked in an on-package method. Further, the memory package 120 composed of the golden device has an advantage in that it is possible to be immediately aware that the AP package 110 is defective in case that a defect occurs during testing. Of course, it is also possible to simultaneously test the memory package 120 and the AP package 110 in consideration of the memory package 120 as another subject of testing without constituting the AP package 110 as the golden device.

Further, in the test apparatus 100 of the disclosure, since the memory package 120 and the AP package 110 are stacked in a state where a reliability test thereof is completed, the yield can be increased. That is, in case of producing the memory package and the AP package as one package, if one of them is changed, the entire test program and test board should be modified, and this causes a problem of an increase of time and costs. In contrast, in the test apparatus of the disclosure, since the memory package 120 and the AP package 110 are separately tested, and then the packages are stacked, only a test tool of the corresponding package is to be changed when the change occurs, and thus the time and costs can be remarkably reduced.

In the test apparatus 100 of the disclosure, since the upper test socket 160 is designed so as to sufficiently endure the load being applied to the upper test socket by using the frame of the upper test socket 160 made of a metal material other than an elastic body as in the related art, the durability of the test socket is increased to improve the lifetime thereof. That is, in the mobile AP, since the number of lower terminals of the AP package is typically about 1000 to 1600 and the number of terminals of the memory package is about 500, the test can be performed only if the pushing force of the pushing part should be applied to the extent that the lower terminal of the AP package can be pressed onto the conductive part of the lower test socket, and thus a lot of load is applied to the upper test socket. In the disclosure, since the frame of a metal material is used as the frame of the upper test socket, the limits of the load being applied from the pushing part can be increased, and thus the durability of the upper test socket can be increased to improve the lifetime thereof.

Figure 6:
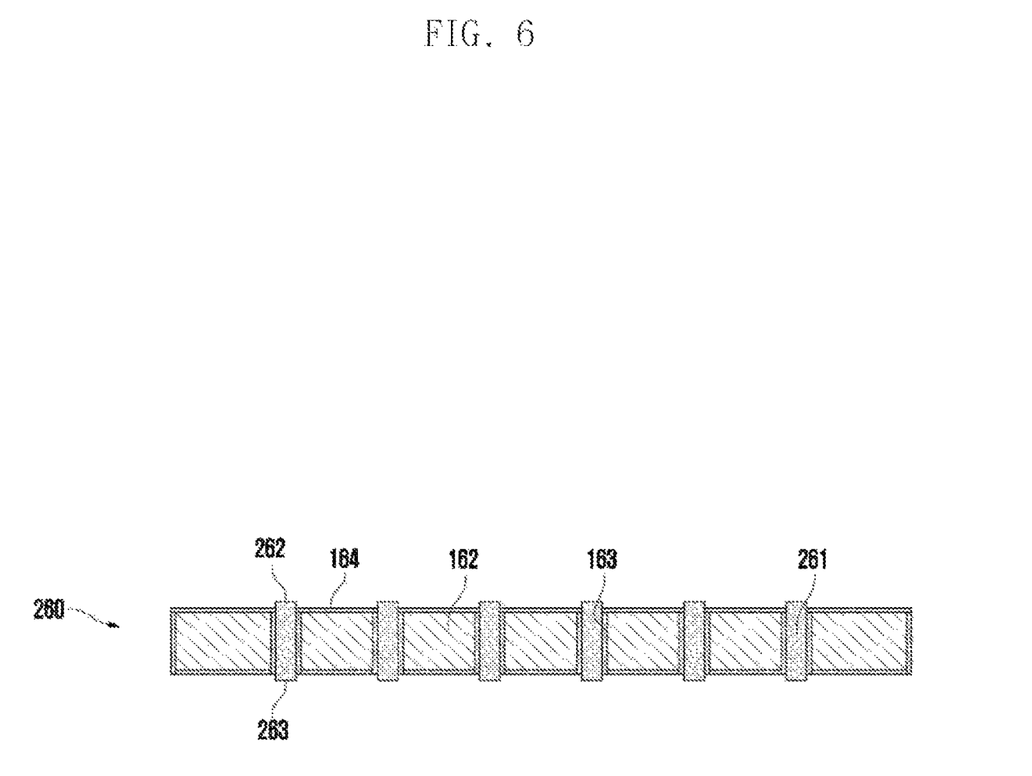
FIG. 6 is a front cross-sectional view illustrating an upper test socket provided in a test apparatus according to another embodiment of the disclosure.

FIG. 6 is a front cross-sectional view illustrating an upper test socket provided in a test apparatus according to another embodiment of the disclosure.

Like the upper test socket according to an embodiment of the disclosure, an upper test socket 260 according to another embodiment of the disclosure includes an inelastic conductive housing 162 having a plurality of housing holes 163, an insulating coating layer 164 coated on the inelastic conductive housing 162, and a second conductive part 161 disposed inside the plurality of housing holes 163 to penetrate the inelastic conductive housing 162 in a thickness direction.

However, the second conductive part 161 of the upper test socket 260 according to another embodiment of the disclosure is different from the upper test socket according to an embodiment of the disclosure on the point that the second conductive part 161 includes a conductive part body 261 located inside the housing hole 163, a conductive part upper bump 262 connected to the conductive part body 261 and projecting from an upper surface of the inelastic conductive housing 162, and a conductive part lower bump 263 projecting from a lower surface of the inelastic conductive housing 162. It is also possible to form only one of the conductive part upper bump 262 and the conductive part lower bump 263.

In the upper test socket 260, since the inelastic conductive housing supports a plurality of conductive parts electrically connecting the terminal of the memory package and the upper terminal of the AP package to each other, the conductive part upper bump or the conductive part lower bump is elastically deformed when the conductive parts are pushed toward the tester by the pushing part, and thus the conductive parts can come in contact with the terminal of the memory package and the upper terminal of the AP package more stably.

Figure 7:
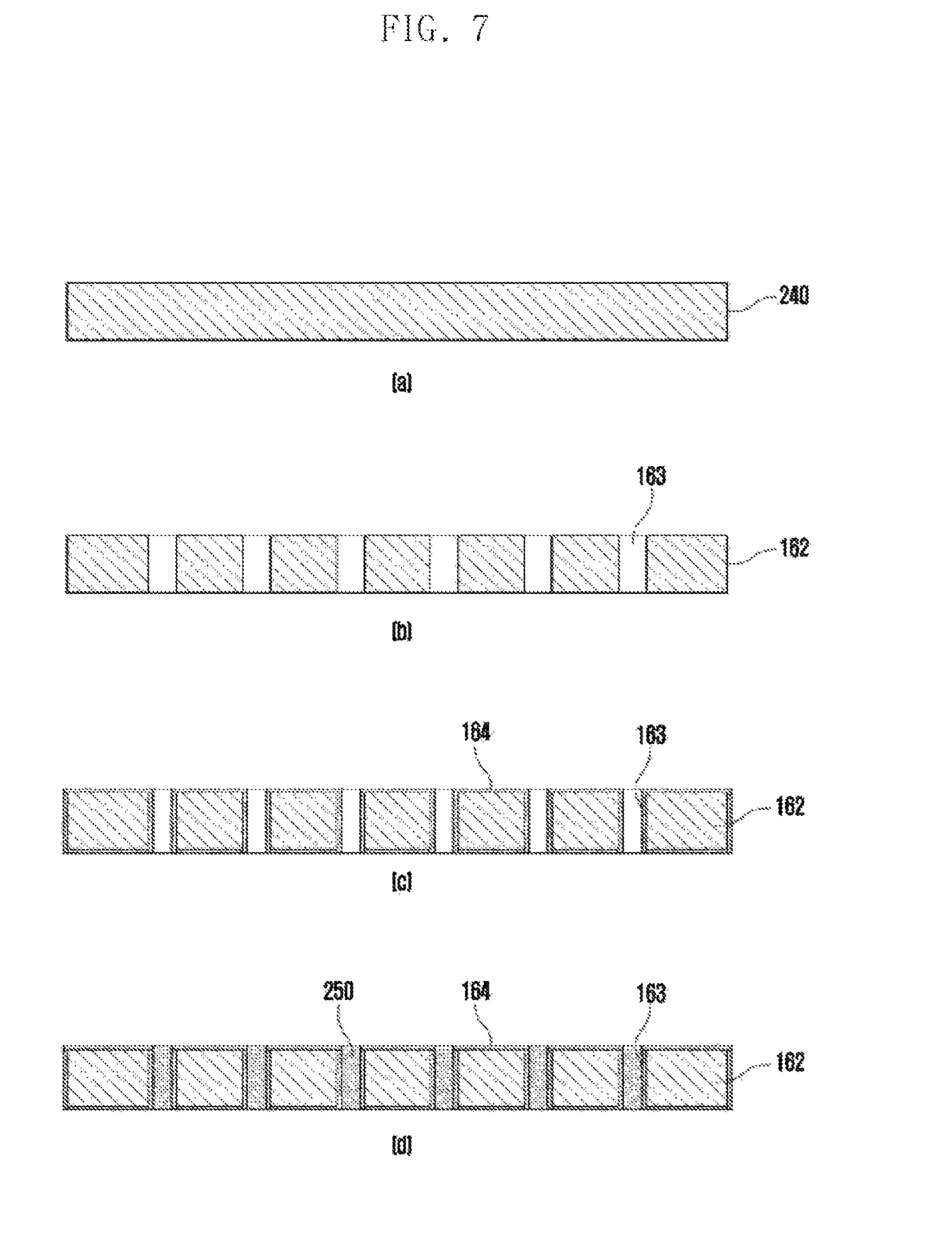
FIG. 7 illustrates a process of manufacturing an upper test socket illustrated in FIG. 3.

The upper test socket 160 illustrated in FIG. 3 may be manufactured in a method illustrated in FIG. 7.

First, as illustrated in (a) of FIG. 7, a frame member 240 made of a metal material having high thermal conductivity is prepared.

Next, as illustrated in (b) of FIG. 7, the inelastic conductive housing 162 is formed by forming, on the frame member 240, the plurality of housing holes 163 that penetrate the frame member 240 in the thickness direction.

Next, as illustrated in (c) of FIG. 7, the insulating coating layer 164 is coated on the inelastic conductive housing 162. The insulating coating layer 164 may be formed only on a circumference of the housing hole 163, may be formed on the circumference, the upper surface, and the lower surface of the housing hole 163, or may be coated all over the inelastic conductive housing 162. As the method for coating the insulating coating layer 164 on the inelastic conductive housing 162, a coating method selected among Teflon coating, DLC coating, parylene coating, anodizing treatment, and liquid silicone coating may be used as described above.

Next, as illustrated in (d) of FIG. 7, a conductive particle mixture 250 including conductive particles in the elastic insulating material is filled in the plurality of housing holes 163. The conductive particle mixture 250 may be pressed into the housing hole 163 in a paste state having liquidity.

Further, a process of curing the conductive particle mixture 250 disposed inside the housing hole 163 is performed. Various methods for curing the conductive particle mixture 250 may be used in accordance with the characteristics of the conductive particle mixture 250, such as a method for heating the mixture at a predetermined temperature and then cooling the mixture at room temperature. Since the conductive particle mixture 250 is cured through a curing process, the second conductive part 161 disposed in the housing hole 163 is formed.

In the method for manufacturing the upper test socket 160 as described above, a process of applying a magnetic field to the conductive particle mixture 250 may be performed before the conductive particle mixture 250 is cured. If the magnetic field is applied to the conductive particle mixture 250, an electrical passage may be formed as the conductive particles being dispersed among an elastic insulating material are oriented in the thickness direction of the inelastic conductive housing 162 by the effect of the magnetic field.

From the foregoing, although the preferred embodiment of the disclosure has been described, the scope of the disclosure is not limited to the form explained and illustrated as above.

For example, the pressure transfer structure for transferring the pushing force of the pushing part to the lower test socket 140 is not limited to that as illustrated above, but may be changed in various ways.

Further, the heat dissipation device may be composed of a heat dissipation plate, or may be composed of another cooling means in addition to the heat dissipation plate and the cooling fan.

As described above, although the disclosure has been illustrated and explained in relation to the preferred embodiment for exemplifying the principle of the disclosure, the disclosure is not limited to the constitution and effects as illustrated and explained above. Rather, it will be well understood by those skilled in the art that many changes and modifications of the disclosure are possible without deviating from the idea and the scope of the appended claims.

What is claimed is:

1. A test apparatus for testing a mobile application processor (AP) provided with an AP package and a memory package, the test apparatus comprising:
    a lower test socket mounted on a tester and connected to the AP package put on an upper side thereof;
    an upper test socket mounted with the memory package and connected to the AP package put on a lower side thereof;
    an upper mechanism configured to accommodate the memory package and mounted with the upper test socket; and
    a heat dissipation device disposed on the upper mechanism,
    wherein the upper test socket is configured to include: an inelastic conductive housing provided with a plurality of housing holes penetratingly formed in a thickness direction, an insulating coating layer coated around the plurality of housing holes, and a conductive part formed in a form in which a plurality of conductive particles are included in an elastic insulating material, disposed in the housing holes, and insulated from the inelastic conductive housing by the insulating coating layer.

2. The test apparatus of claim 1, wherein the inelastic conductive housing is made of a material having a thermal conductivity that is equal to or greater than 10 W/mK.

3. The test apparatus of claim 1, wherein the inelastic conductive housing is made of a metal material.

4. The test apparatus of claim 1, wherein the memory package is a golden device that is a good quality package.

5. The test apparatus of claim 1, wherein the insulating coating layer is coated all over the inelastic conductive housing.

6. The test apparatus of claim 1, wherein the insulating coating layer is formed by a coating method selected among Teflon coating, DLC coating, parylene coating, anodizing treatment, and liquid silicone coating.

7. The test apparatus of claim 1, wherein the heat dissipation device comprises a heat dissipation plate or a cooling fan.

8. The test apparatus of claim 1, wherein the upper mechanism is a pusher or a handler.

9. The test apparatus of claim 1, wherein the conductive part comprises: a conductive part body put in the housing hole, and at least one of a conductive part lower bump projecting from a lower surface of the inelastic conductive housing and a conductive part upper bump projecting from an upper surface of the inelastic conductive housing, being connected to the conductive part body.

* * * * *